US009935597B2

(12) United States Patent
Erdmann et al.

(10) Patent No.: US 9,935,597 B2
(45) Date of Patent: Apr. 3, 2018

(54) CIRCUIT FOR AND METHOD OF RECEIVING AN INPUT SIGNAL

(71) Applicant: Xilinx, Inc., San Jose, CA (US)

(72) Inventors: Christophe Erdmann, Dublin (IE); Diarmuid Collins, Navan (IE); Edward Cullen, Naas (IE); Ionut C. Cical, Saggart (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/167,197

(22) Filed: May 27, 2016

(65) Prior Publication Data

US 2017/0346455 A1    Nov. 30, 2017

(51) Int. Cl.
    *H03F 3/45*    (2006.01)
    *H03F 1/56*    (2006.01)

(52) U.S. Cl.
    CPC ......... *H03F 3/45179* (2013.01); *H03F 1/56* (2013.01); *H03F 3/45183* (2013.01); *H03F 2203/45288* (2013.01)

(58) Field of Classification Search
    CPC .......... H03F 3/45179; H03F 1/56; H03F 3/45; H03F 3/45183; H03F 3/45188; H03F 1/565; H03F 3/191; H03F 2200/222; H03F 2200/318
    USPC ................................................. 330/252, 253
    See application file for complete search history.

(56) References Cited

U.S. PATENT DOCUMENTS

| | | |
|---|---|---|
| 6,445,245 B1 | 9/2002 | Schultz et al. |
| 6,489,837 B2 | 12/2002 | Schultz et al. |
| 6,650,720 B1 | 11/2003 | Grung et al. |
| 6,760,205 B1 | 7/2004 | Gaboury |
| 6,963,218 B1 | 11/2005 | Alexander et al. |
| 7,007,121 B1 | 2/2006 | Ansari et al. |
| 7,019,562 B1 | 5/2006 | Ferris, III |
| 7,271,651 B2* | 9/2007 | Chen ............... H03F 3/4565 330/253 |
| 7,362,174 B2* | 4/2008 | Cao ................. H03F 3/195 330/253 |

(Continued)

OTHER PUBLICATIONS

Redoute, Jean-Michel et al., "Kuijk Bandgap Voltage Reference Reference with High Immunity to EMI," IEEE Transactions on Circuits and Systems—II: Express Briefs, Feb. 2010, pp. 75-79, vol. 57, No. 2, IEEE, Piscataway, New Jersey, USA.

(Continued)

*Primary Examiner* — Khanh V Nguyen

(74) *Attorney, Agent, or Firm* — John J. King

(57) ABSTRACT

A circuit for receiving an input signal is described. The receiver comprises a first receiver input configured to receive a first input of a differential input signal; a second receiver input configured to receive a second input of a differential input signal; a differential pair having an inverting input and a non-inverting input; a first impedance matching element coupled to the differential pair, wherein the first impedance matching element provides DC impedance matching from the inverting input and non-inverting input of the differential pair; and a second impedance matching element coupled to the differential pair, wherein the second impedance matching element provides AC impedance matching from the inverting input and non-inverting input of the differential pair.

20 Claims, 4 Drawing Sheets

(56) References Cited

U.S. PATENT DOCUMENTS

| | | |
|---|---|---|
| 7,573,331 B2 * | 8/2009 | Nainar .................... H03F 1/26 330/253 |
| 7,653,505 B1 | 6/2010 | Simmons et al. |
| 8,412,497 B1 | 4/2013 | Alexander |
| 8,446,169 B1 | 5/2013 | Marlett et al. |
| 8,638,084 B1 | 1/2014 | Abugharbieh et al. |
| 9,000,800 B1 | 4/2015 | Cical et al. |
| 9,252,985 B2 | 2/2016 | Cho |

OTHER PUBLICATIONS

Orietti, Enrico et al., "Reducing the EMI Susceptibility of a Kuijk Bandgap," IEEE Transactions on Electromagnetic Compatibility, Nov. 2008, pp. 876-886, vol. 50, No. 4, IEEE, Piscataway, New Jersey, USA.

\* cited by examiner

CIRCUIT FOR AND METHOD OF RECEIVING AN INPUT SIGNAL

TECHNICAL FIELD

The present invention relates generally to data receivers, and in particular, to a circuit for and a method of receiving an input signal.

BACKGROUND

A differential pair is one of the most commonly used circuits in analog design. A differential pair comprises 2 transistors sharing a common source and may be employed as the input stage to a current amplifier, such as an operational transconductance amplifier (OTA). An OTA is a voltage controlled current source whose differential input voltage produces and output current. A differential pair is popular because it achieves much lower offsets and much higher rejection of common mode disturbances over a conventional, single-ended input stage. Where input common mode ranges allow, p-channel metal oxide semiconductor (PMOS) differential pairs are preferred over their N-channel metal oxide semiconductor (NMOS) counterparts. One reason that a PMOS differential pair is preferred is because the source and bulks of a PMOS transistor can be shorted in a conventional device to eliminate supply disturbances coupling through the PMOS bulks to the OTA output. This makes a PMOS differential pair more robust to supply disturbances than its NMOS counterpart.

However, it is not possible to short the source and bulks of a PMOS transistor when using a modern "triple well" or "deep N-well" (DNW) process. Modern triple well or DNW processes provide deep N-well isolation which enable sensitive analog blocks (such as an OTA) to be isolated from noisy substrates. This is advantageous for system on chip (SOC) ICs where sensitive analog blocks co-exist on the same piece of silicon as noisy high frequency digital blocks. However, the problem with deep N-well isolation is that the DNW is connected to power. Because the DNW is shorted to the N-well (NW) of a PMOS, the bulk of a PMOS is therefore also connected to power and hence cannot be shorted to its source. As a result, a PMOS differential pair with DNW isolation experiences the same inferior rejection of supply disturbances as an NMOS differential pair.

Supply disturbances at the bulks of an OTA's input differential pair couple currents across the bulk/gate capacitances (Cbg) to the OTA differential pair gate inputs. From here, these currents are converted into voltages by flowing across impedances. If these impedances are not equal, a differential voltage will develop at the OTA inputs to which its output will react. The degree to which the OTA output moves in relation to the supply disturbances is quantified by its power supply rejection ratio (PSRR). The PSRR is the inverse ratio of the disturbance on the supply line to that of the output, and is typically given in units of decibels (dB).

Accordingly, circuits and methods that improve the performance of a differential pair are beneficial.

SUMMARY

A circuit for receiving an input signal is described. The circuit comprises a first receiver input configured to receive a first input of a differential input signal; a second receiver input configured to receive a second input of a differential input signal; a differential amplifier having an inverting input and a non-inverting input; a first impedance matching element coupled to the differential pair, wherein the first impedance matching element provides DC impedance matching from the inverting input and non-inverting input of the differential pair; and a second impedance matching element coupled to the differential pair, wherein the second impedance matching element provides AC impedance matching from the inverting input and non-inverting input of the differential pair.

A method of receiving an input signal is also described. The method comprises configuring a first receiver input to receive a first input of a differential input signal; configuring a second receiver input to receive a second input of a differential input signal; implementing a differential pair having an inverting input and a non-inverting input; coupling a first impedance matching element to the differential pair, wherein the first impedance matching element provides DC impedance matching from the inverting input and non-inverting input of the differential pair; and coupling a second impedance matching element to the differential pair, wherein the second impedance matching element provides AC impedance matching from the inverting input and non-inverting input of the differential pair.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods achieve a differential pair with high immunity to supply (i.e. power and ground) and substrate disturbances. It is applicable to any OTA whose input differential pair source/bulk connections cannot be shorted. High immunity is achieved by inserting an impedance matching network at the OTA inputs to reduce supply disturbances to common mode disturbances, which are typically rejected by the OTA to greater than 60 dB. The circuits and methods rely upon the common mode rejection capability of a differential pair by inserting an impedance network at the OTA inputs to force the impedances looking out from the OTA inputs to be equal. As a result, the disturbance currents coupling across Cbg are transformed into a common mode disturbance at the OTA inputs, which can be rejected to within its common rejection capability, typically greater than 60 dB. That is, the circuits and methods address the issue of disturbance currents by increasing the rejection of supply disturbances of a differential pair where its source/bulk connections cannot be shorted. The circuits and methods find particular application in differential pairs existing on complex SOC's where high immunity to a noisy substrate and to a noisy supply is beneficial.

The circuits and methods achieve the high immunity to noise by inserting an impedance matching network which uses the common mode rejection capability of a differential pair to cancel effects of supply disturbance. The circuits and methods are applicable to any OTA whose input differential pair source/bulk connections cannot be shorted. The circuits and methods retain DNW isolation and therefore enable a high immunity to both supply and substrate disturbances.

Figure 1:
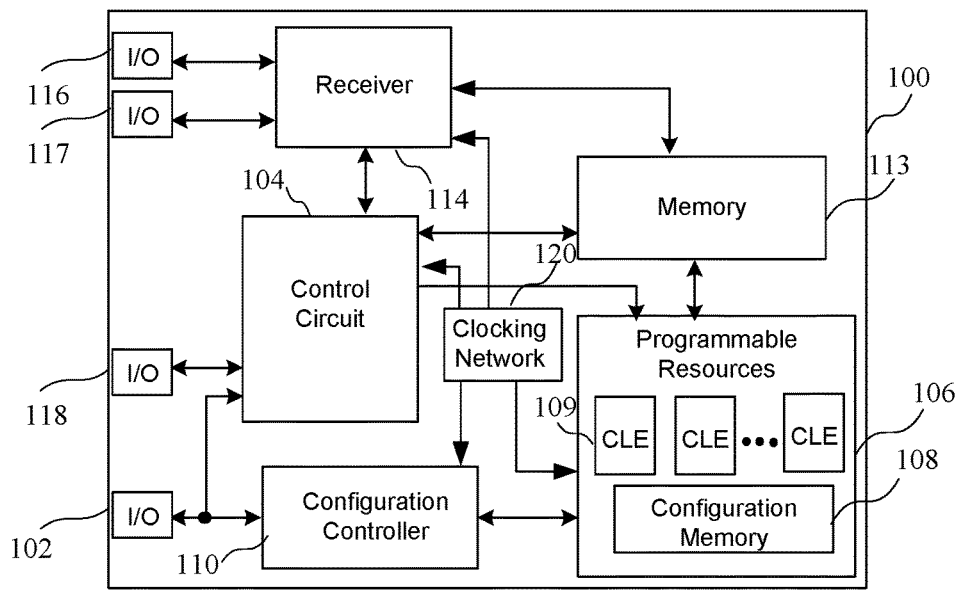
FIG. 1 is a block diagram of an integrated circuit comprising a circuit for receiving data in the integrated circuit.

Turning first to FIG. 1, a block diagram of an integrated circuit 100 comprising a circuit for routing data in the integrated circuit is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
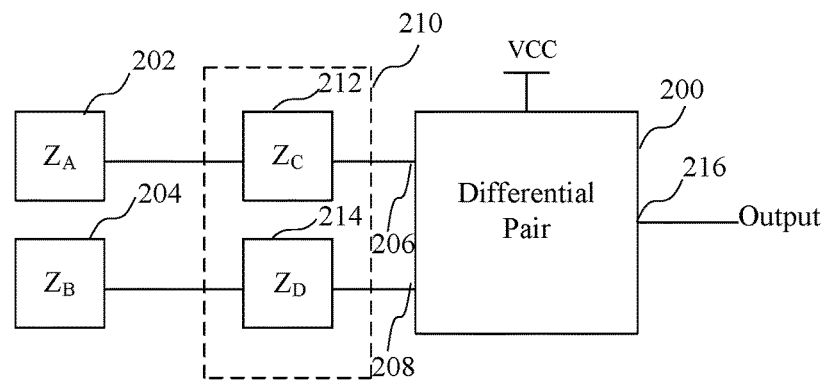
FIG. 2 is a block diagram of a differential amplifier for receiving data having an impedance matching circuit.

Turning now to FIG. 2, a block diagram of a differential pair for receiving data is shown. A differential pair 200 is coupled to an impedance 202 and an impedance 204 at corresponding inputs 206 and 208. That is, the impedances looking out from the inputs 206 and 208 would be $Z_A$ and $Z_B$, respectively. According to the circuits and methods for receiving data set forth in more detail below, an impedance matching circuit 210 including a first impedance matching element 212, having an impedance $Z_C$, and a second impedance matching element 214, having an impedance $Z_D$. As will be described in more detail in the example of FIG. 3, the circuit achieves high immunity to noise by inserting an impedance matching network which uses the common mode rejection capability of a differential pair to cancel effects of supply disturbance.

Figure 3:
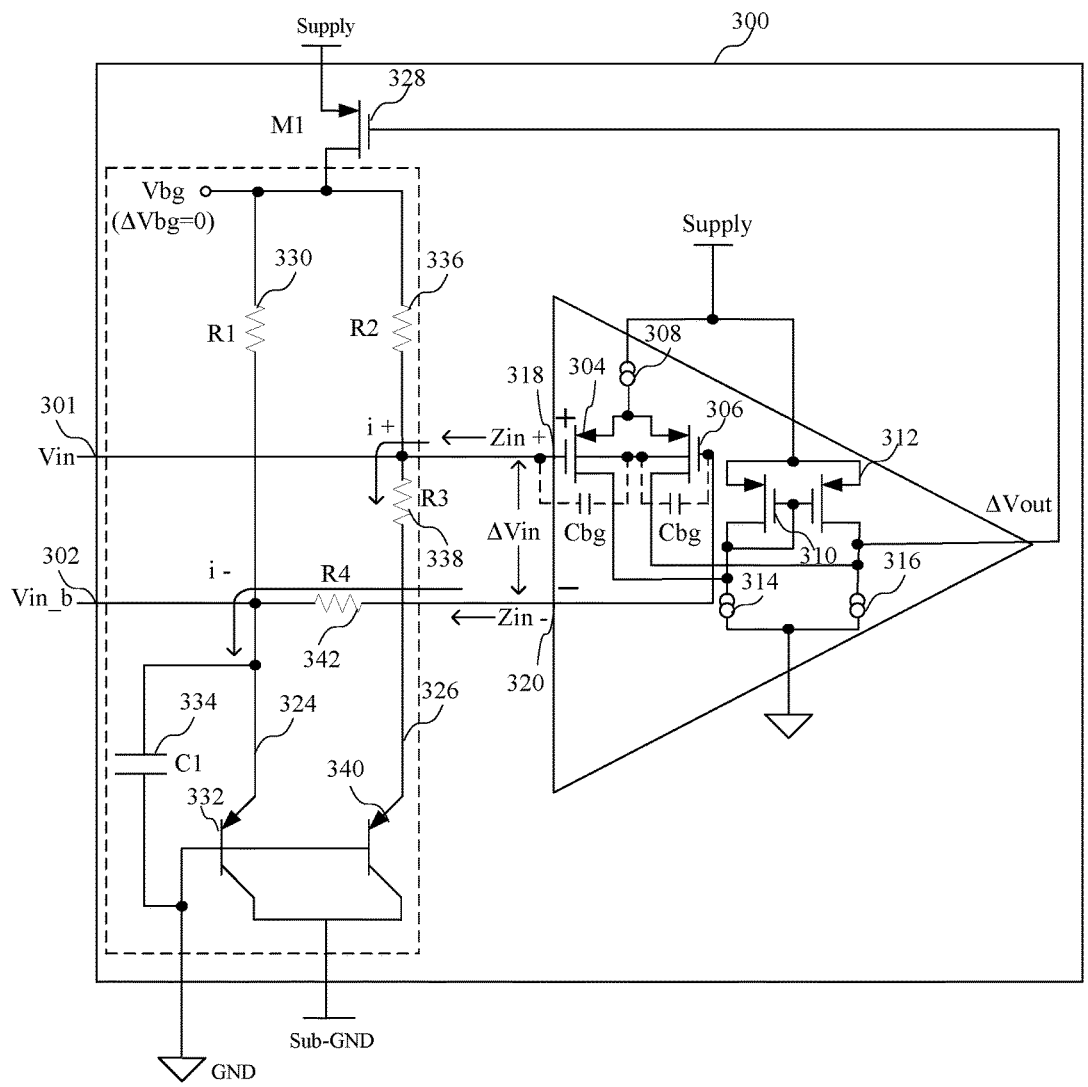
FIG. 3 is a block diagram of a differential amplifier for receiving data showing an example of an impedance matching circuit.

Turning now to FIG. 3, a block diagram of a differential pair for receiving data providing an example of an impedance matching circuit is shown. A current amplifier 300 has a first receiver input 301 coupled to receive a first input Vin of a differential input signal, and a second receiver input 302 coupled to receive a second input Vin_b of the differential input signal. The current amplifier comprises a differential pair consisting of PMOS transistors 304 and 306 having sources coupled to a current source 308 at a supply voltage. A second pair of PMOS transistors 310 and 312 are coupled between the supply voltage and corresponding current sources 314 and 316 as shown. A positive input 318 of the differential pair, receiving the input signal (Vin) of a differential input signal, is coupled to the gate of transistor 304, and a negative input 320 of the differential pair, receiving the inverted input (Vin_b) is coupled to the gate of transistor 306.

A bandgap circuit 321 having a first current path 324 and a second current path 326 is provided at the inputs of the differential pair. The current paths provide, by way of a PMOS transistor 328, current necessary to keep the voltages at the inputs of the differential amplifier stable. The first current path comprises a first resistor 342 and a first bi-polar junction transistor (BJT) 332, where impedance matching elements 334 and 342 are coupled between the inverting input and the ground (GND) node. The second current path comprises resistors 336 and 338 and second BJT transistor 340. A voltage ΔVin is generated at the inputs of the differential pair based upon a first current i+ at the non-inverting input 318 and a second current I− at the inverting input 320.

Supply disturbances at the bulks of the input differential pair transistors 304 and 306 couple currents across the bulk/gate capacitances (Cbg) to the OTA (differential pair gate) inputs. These currents are converted into voltages by flowing across impedances at the inputs. If these impedances are not equal, a differential voltage will develop at the OTA inputs, which will affect its output. The degree to which the OTA output moves in relation to the supply disturbances at the bulk is quantified by its power supply rejection ratio (PSRR), which is the inverse ratio of the disturbance on the supply line to that of the output, and is typically given in units of decibels (dB). Supply disturbance coupling across Cbg can drain |PSRR| from approximately 70 dB at DC to less 20 dB at AC. The circuit of FIG. 3 exploits the common mode rejection capability of a differential pair by inserting an impedance network at the OTA inputs to force the impedances looking out from the OTA inputs to be equal. The result is the disturbance currents coupling across Cbg to be transformed into a common mode disturbance at the OTA inputs, which it can reject to within its common rejection capability, typically greater than 60 dB.

Due to lower offsets, differential pairs are typically implemented in the input stage of an OTA. Where source/bulk connections of the differential pair transistors cannot be shorted, differential pairs suffer from supply disturbances coupling through their bulks, which reduces their ability to reject supply disturbances. PMOS input differential pairs are typically preferred over NMOS differential pairs because, in conventional processes, their source/bulk connections can be shorted. Deep N-well processes for P-channel transistors as shown and described in reference to FIG. 5 enable deep N-well (DNW) isolation, which enables isolating sensitive analog circuitry (such as an OTA) from a noisy substrate. Such isolation is particularly beneficial in SOC's where sensitive analog and noisy high frequency digital blocks share the same piece of silicon. However, to achieve DNW isolation, PMOS differential pair source/bulk connections cannot be shorted, which reduces their ability to reject supply disturbance to that of an NMOS differential pair. Therefore, the circuits and methods enable a differential pair (NMOS/PMOS), whose source/bulk connections cannot be shorted, achieve high immunity to supply (power/ground) and substrate disturbances. Supply disturbance (coupling through input differential pair bulks) affects an OTA when impedances looking out from an OTA's inverting (Zin−) and non-inverting (Zin+) inputs are unequal. By inserting an impedance matching network $Z_C$ and $Z_D$ to force Zin−= Zin.+, the supply disturbances are converted to a common-mode disturbance which can be rejected by the OTA.

Supply disturbance through PMOS differential pair bulks affects a bandgap by coupling currents (i+ and i−) across PMOS differential pair bulk/gate capacitances (Cbg). Without impedance matching elements 342 and 334, impedances seen by i+ and I− currents shown in FIG. 3 are different because Zin+ is not equal to Zin−. A differential voltage ΔVin then develops at the OTA inputs, where ΔVin= (i+•Zin+)−(i−•Zin−). The OTA output ΔVout will then move in response to ΔVin. As a result, the result is bandgap output voltage (Vbg) shifts up or down. By inserting an impedance matching network the impedances (Zin+ and Zin−) can be forced to be equal resulting in zero input differential voltage, ΔVin=0. For the bandgap circuit of FIG. 3, calculation of the impedance matching elements (342 and 334) is as follows:

$$Zin+=(ZB1+R3)\|(R2+Zo1);$$

and $$Zin-=ZB2\|(R1+Zo1),$$

where Z01 corresponds to the output impedance of M1 (i.e. transistor 38). The impedances of the BJT transistors is:
  ZB=1/gm∥ZCBJT, and therefore
  ZB≈1/gm=Vt/I at DC, and
  ZB≈ZCBJT=1/(ωCBJT) at AC
From these expressions, Zin+ can be seen to differ from Zin− by R3 at DC and ΔCBJT at AC, where ΔCBJT=CBJT1−CBJT2. Therefore, inserting R4=R3 and C1=ΔCBJT forces Zin+=Zin− and hence Δvin=0.
Because R4 is located at the gate input, negligible current flows across it causing the loop dynamics to be unaffected. Therefore, the circuits and methods enable a differential pair to achieve high immunity to supply (power/ground) and substrate disturbances without adversely affecting loop performance. While the amplifier architecture of FIG. 3 is a folded cascode OTA with a PMOS input differential pair, the circuits and methods are applicable to any OTA whose input differential pair source/bulk connections cannot be shorted.

Figure 4:
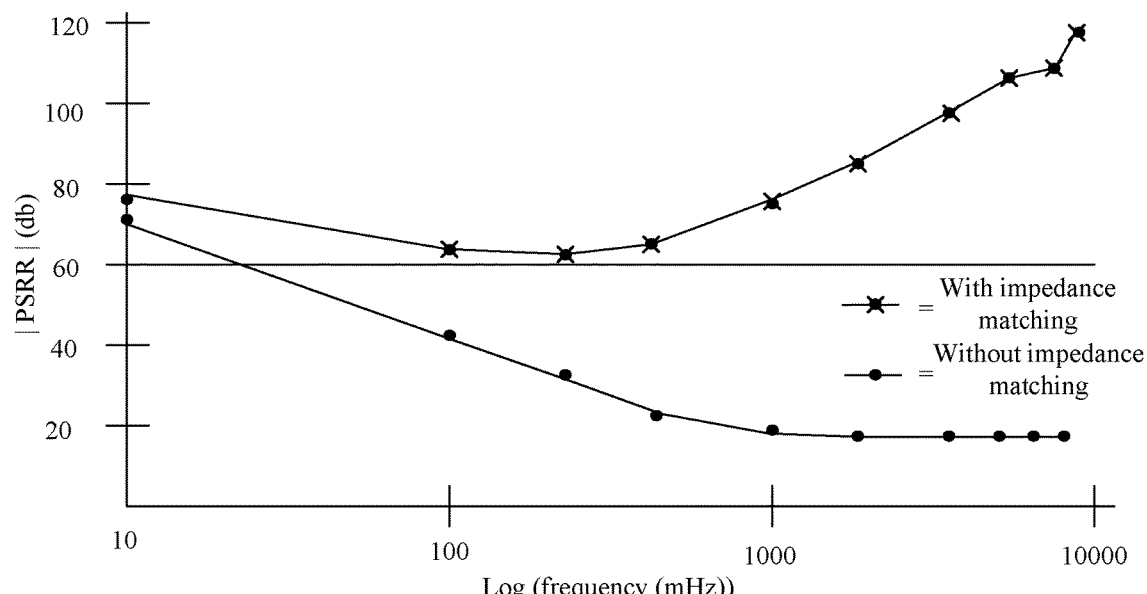
FIG. 4 is a plot showing power supply rejection ratio as a function of frequency.

Turning now to FIG. 4, a plot showing power supply rejection ratio as a function of frequency. The invention has been demonstrated on a working bandgap where an impedance matching network consisting of an additional capacitor and resistor was inserted at the inputs to the bandgaps OTA. As shown in the plot, the circuit of FIG. 3 has improved PSRR from 1 to 6 GHz, at worst case process corner, by up to 45 dB.

Figure 5:
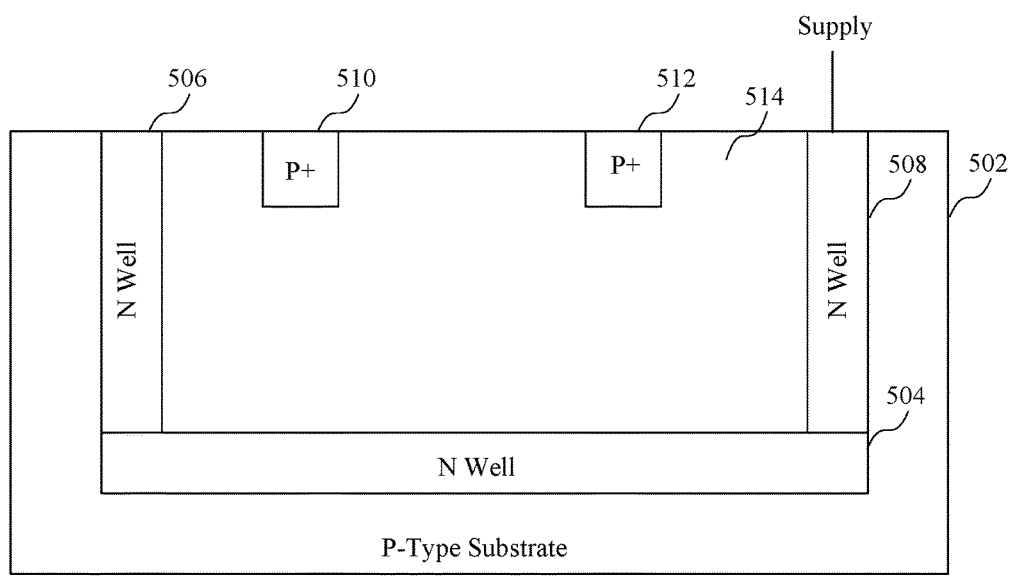
FIG. 5 is a block diagram of a PMOS transistor having a deep N-well.

Turning now to FIG. 5, a block diagram of a PMOS transistor having a deep N-well is shown. A P-type substrate 502 comprises a deep N-well 504, and N-well contacts 506 and 508 extending to the deep N-well 504. As shown in FIG. 5, the N-well 508 is coupled to a supply voltage. The P-wells 510 and 512 of a P-channel transistor are formed in the N-well 514 The circuit of FIG. 3 is applicable to any OTA whose differential pair whose source/bulk connections cannot be shorted, such as when implementing a P-channel transistor as shown in FIG. 5. It is of particular importance to such differential pairs existing on complex SOC's where high immunity to a noisy substrate is required, in addition to high immunity to a noisy supply.

Figure 6:
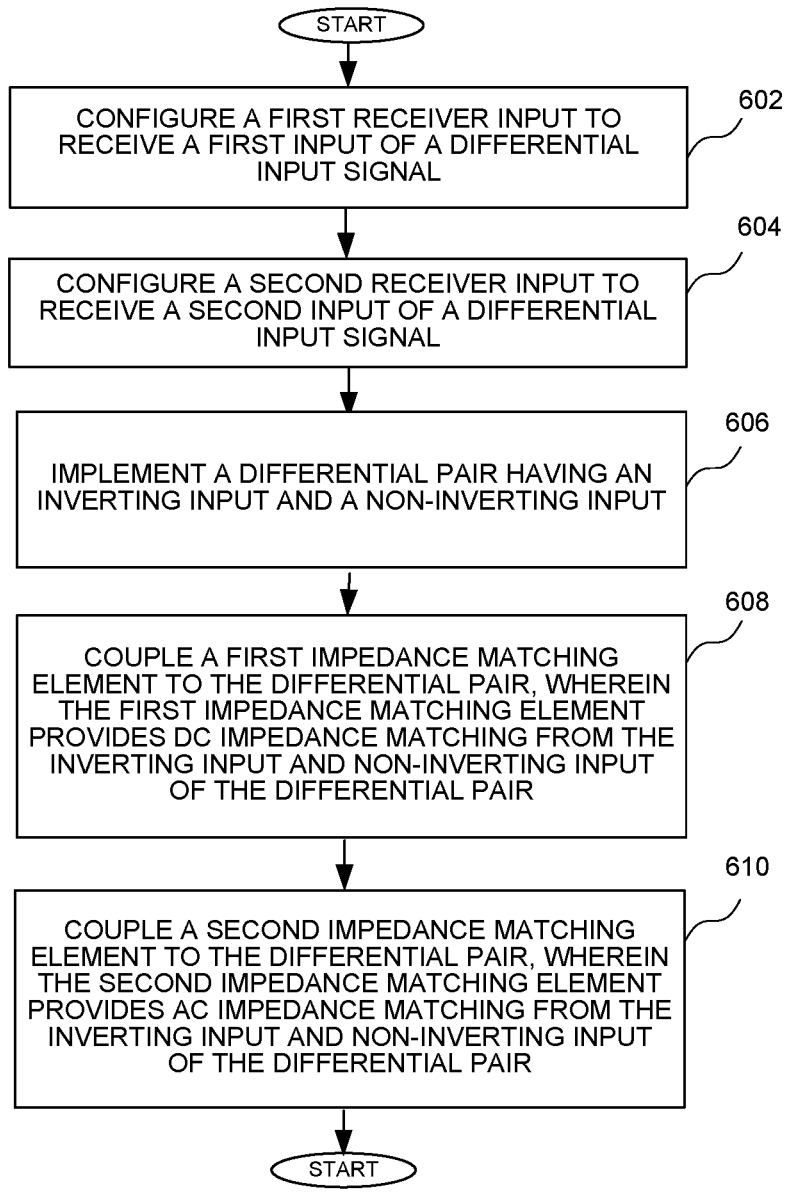
FIG. 6 is a flow chart showing a method of receiving data using a differential pair having impedance matching.

Turning now to FIG. 6, a flow chart shows a method of receiving data. A first receiver input is configured to receive a first input of a differential input signal at a block 602. A second receiver input is configured to receive a second input of a differential input signal at a block 604. A differential pair having an inverting input and a non-inverting input is implemented at a block 606. The differential pair could be implemented as described in FIG. 3 for example. A first impedance matching element is coupled to the differential amplifier, wherein the first impedance matching element provides DC impedance matching from the inverting input and non-inverting input of the differential amplifier at a block 608. The impedance matching element could be the resistor 342 of FIG. 3 for example. A second impedance matching element is coupled to the differential amplifier, wherein the second impedance matching element provides AC impedance matching from the inverting input and non-inverting input of the differential amplifier at a block 610. The second impedance matching element could be the capacitor 334 for example. The flow chart of FIG. 6 can be implemented using the circuits of FIGS. 1-3 for example, or any other suitable circuit. While specific elements and details related to the specific elements of the method of FIG. 6 are shown in blocks, it should be understood additional elements and additional details related to the elements could be implemented as described in reference to FIGS. 1-3.

It can therefore be appreciated that new to circuits for and methods of receiving data have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for receiving a differential input signal, the circuit comprising:
   a first receiver input configured to receive a first input of the differential input signal;
   a second receiver input configured to receive a second input of the differential input signal;
   a differential pair having an inverting input and a non-inverting input;
   a first impedance matching element coupled to the differential pair, wherein the first impedance matching element provides DC impedance matching from the inverting input and non-inverting input of the differential pair; and
   a second impedance matching element coupled to the differential pair, wherein the second impedance matching element provides AC impedance matching from the inverting input and non-inverting input of the differential pair.

2. The circuit of claim 1 wherein the first impedance matching element comprises a first resistor.

3. The circuit of claim 2 wherein the first resistor is associated with a first current path from the inverting input of the differential pair.

4. The circuit of claim 3 wherein the first current path comprises a bipolar junction transistor.

5. The circuit of claim 2 further comprising a second resistor associated with a second current path associated with the non-inverting input, wherein the impedance from the inverting input is equal to the impedance from the non-inverting input.

6. The circuit of claim 1 wherein the second current path comprises a bipolar junction transistor.

7. The circuit of claim 1 wherein the second impedance matching element comprises a capacitor.

8. The circuit of claim 1 further comprising a first PMOS transistor associated with the inverting input of the differential pair.

9. The circuit of claim 8 further comprising a second PMOS transistor associated with the non-inverting input of the differential pair.

10. The circuit of claim 9 wherein each of the first PMOS transistor and the second PMOS transistor is a deep N-well transistor.

11. A method of receiving a differential input signal, the method comprising:
- configuring a first receiver input to receive a first input of the differential input signal;
- configuring a second receiver input to receive a second input of the differential input signal;
- implementing a differential pair having an inverting input and a non-inverting input;
- coupling a first impedance matching element to the differential pair, wherein the first impedance matching element provides DC impedance matching from the inverting input and non-inverting input of the differential pair; and
- coupling a second impedance matching element to the differential pair, wherein the second impedance matching element provides AC impedance matching from the inverting input and non-inverting input of the differential pair.

12. The method of claim 11 wherein coupling the first impedance matching element to the differential pair comprises coupling a first resistor to the differential pair.

13. The method of claim 11 wherein the first resistor is associated with a first current path from the inverting input of the differential pair.

14. The method of claim 13 wherein the first current path comprises a bipolar junction transistor.

15. The method of claim 11 further comprising a second resistor associated with a second current path associated with the non-inverting input, wherein the impedance from the inverting input is equal to the impedance from the non-inverting input.

16. The method of claim 15 wherein the second current path comprises a bipolar junction transistor.

17. The method of claim 11 wherein the second impedance matching element comprises a capacitor.

18. The method of claim 11 further comprising implementing a first PMOS transistor associated with the inverting input of the differential pair.

19. The method of claim 18 further comprising implementing a second PMOS transistor associated with the non-inverting input of the differential pair.

20. The method of claim 19 wherein each of the first PMOS transistor and the second PMOS transistor are deep N-well transistors.

* * * * *